United States Patent [19]

Chiu et al.

[11] Patent Number: 4,843,023

[45] Date of Patent: Jun. 27, 1989

[54] PROCESS FOR FORMING LIGHTLY-DOPED-DRAIN (LDD) WITHOUT EXTRA MASKING STEPS

[75] Inventors: Kuang Y. Chiu, Palo Alto; Fu-Chieh Hsu, Cupertino, both of Calif.

[73] Assignee: Hewlett-Packard Company, Palo Alto, Calif.

[21] Appl. No.: 65,617

[22] Filed: Jun. 30, 1987

Related U.S. Application Data

[63] Continuation of Ser. No. 779,919, Sep. 25, 1985, abandoned.

[51] Int. Cl.[4] .......................................... H01L 21/265
[52] U.S. Cl. ........................................ 437/34; 437/44; 437/27; 437/28; 437/29; 437/30; 437/41; 437/57; 437/241; 437/233; 156/643; 357/23.3
[58] Field of Search .............. 156/643; 357/23.3, 23.9, 357/90, 91; 437/34, 57, 41, 42, 44, 30, 29, 28, 27, 241, 238, 233; 427/93

[56] References Cited

U.S. PATENT DOCUMENTS

| | | |
|---|---|---|
| 679,618 | 12/1984 | Chiu . |
| 4,065,808 | 12/1977 | Schomberg et al. ................. 364/200 |
| 4,209,350 | 6/1980 | Ho et al. .............................. 148/188 |
| 4,234,362 | 11/1980 | Riseman ............................... 148/187 |
| 4,324,038 | 4/1982 | Chong et al. .......................... 29/571 |
| 4,366,613 | 12/1980 | Ogura et al. .......................... 29/571 |
| 4,486,943 | 12/1984 | Ryden et al. .......................... 29/571 |
| 4,488,351 | 12/1984 | Momose ................................ 437/41 |
| 4,530,150 | 7/1985 | Shirato ................................... 437/34 |
| 4,536,944 | 8/1985 | Bracco et al. .......................... 29/571 |
| 4,575,026 | 7/1988 | Woo et al. ............................. 437/29 |
| 4,577,391 | 3/1986 | Hsia et al. ............................. 437/44 |
| 4,599,789 | 7/1986 | Gasner ................................... 437/41 |
| 4,613,882 | 9/1986 | Pimbley et al. ...................... 357/23.3 |
| 4,637,124 | 1/1987 | Okuyama et al. ..................... 437/41 |
| 4,642,878 | 2/1987 | Maeda ................................... 437/34 |
| 4,680,603 | 7/1987 | Wei et al. ............................ 357/23.3 |
| 4,722,909 | 2/1988 | Parrillo et al. ........................ 437/44 |
| 4,728,617 | 3/1988 | Woo et al. ............................. 437/44 |
| 4,745,086 | 5/1988 | Parrillo et al. ........................ 437/44 |

FOREIGN PATENT DOCUMENTS 138379  8/1984  Japan .
193371A 10/1985 Japan .

OTHER PUBLICATIONS

Ghandhi, *VLSI Fabrication Principles*, John Wiley & Sons, Inc., 1983.
Mogab et al., "Anisotropic Plasma Etching of Polysilicon", J. Vac. Sci. Technol, vol. 17, No. 3, May/Jun., 1980.
Mader, "Anisotropic Plasma Etching of Polysilicon with CF$_4$", Abstract No. 104, ECS Spring Meeting, 1980.
Parry et al., "Anisotropic Plasma Etching of Semiconductor Materials", Solid State Technology, vol. 22, No. 4, 1979.
Miyamoto et al, "A 1.0 $\mu$m N-well CMOS/Bipolar Technology for VLSI Circuits", IEDM 1983, pp. 63-66.
Antipov, "Mask Independent Short Channel MOS", IBM Tech. Discl. Bulletin, 21(12), 5/79, pp. 4852–4854.
Ghandi, VLSI Fabrication Principles–Silicon and Gallium Arsenide, John Wiley & Sons, 1983, pp. 353–354.
(List continued on next page.)

Primary Examiner—Brian E. Hearn
Assistant Examiner—M. Wilczewski

[57] ABSTRACT

A new lightly doped drain (LDD) process which does not required extra masking steps as compared to the conventional CMOS process is presented. By employing a new two layer side wall spacer technology, the LDD ion implantation for n-channel and p-channel devices can be carried out by sharing the n+ or p+ source and drain ion implantation mask. This approach provides maximum flexibility in designing optimum n$^-$ and p$^-$ channel LDD MOSFETs without using any additional mask steps other than the conventional CMOS mask levels. This process is also compatible with self-aligned silicide process.

6 Claims, 6 Drawing Sheets

OTHER PUBLICATIONS

Tsong, "Fabrication of High-Performance LDDFET's with Oxide Sidewall-Spacer Technology", IEEE Journal of Solid-State Circuits, vol. SC-17, #2, Apr. 1982.
Elimination of Hot Electron Gate Current by the Lightly Doped Drain-Source Structure by Seiki Ogura, et al., IEDM 81, pp. 651-654.
Design and Characteristics of Lightly Doped Drain-Source (LDD) Insulated Gate Field-Effect Transistor by Seiki Ogura, et al., IEEE Transactions on Electron Devices, vol. ED-27, No. 8, Aug. 1980, pp. 1359-1367.
Yemini, "Tingernet: Or is There Life Between LANs and PBXs," *Proc. ICC* 1983, vol. 3 (Boston, Jun. 1984), pp. 1501-1505.
T. N. Sadaawi et al, "Distributed Switching for Data Transmission Over Two-Way CATV," *Proc. ICC* 1984 (Amsterdam, May 1984), pp. 1409-1413.
J. R. Pierce, "How Far Can Data Loops Go?", *IEEE Trans. on Comm.*, vol. M-20, No. 3 (Jun. 1972), pp. 527-530.
C. Petitpierre, "Meshed Local Computer Networks," *IEEE Comm. Mag.*, vol. 22, No. 8 (Aug. 1984), pp. 36-40.
C. S. Raghavendra et al., "Optimal Loop Topologies for Distributed Systems," *IEEE* 1981, CH-1694 (University of California, Los Angeles, CA), pp. 218-223.
M. Schlatter et al., "Capacity of Interconnected Ring Communication Systems with Unique Loop-Free Routing," IEEE Trans. on Info. Theory, vol. IT-29, No. 5 (Sep. 1983), pp. 774-779.

PROCESS FOR FORMING LIGHTLY-DOPED-DRAIN (LDD) WITHOUT EXTRA MASKING STEPS

CROSS REFERENCE TO RELATED APPLICATION

This application is a continuation, of application Ser. No. 779,919, filed 9/25/85, now abandoned.

BACKGROUND AND SUMMARY

By increasing the packing density, VLSI circuits have been scaled down considerably. Unfortunately, the smaller dimensions of the devices are associated with numerous physical phenomena and effects which interfere with the design and operation of these devices. One such phenomena, hot-electron effects, is caused by the ever-increasing channel electric fields in scaled-down devices. The resulting excessive hot-electron substrate current can cause several problems. Most notable are overloading the on-chip substrate-bias generator, variations in threshold voltages, snap-back (avalanche) breakdown in a MOSFET transistor, or latch-up in CMOS circuits. Furthermore, the minority current in the substrate, which is generated by injection from the source substrate junction or by photons emitted from the high electric fields in the drain region of the transistor, can cause DRAM (dynamic random access memory) refresh-time degradation and can discharge other charge-storage or low-current carrying nodes. The threshold shift and transconductance degradation due to interface-state generation by high-energy electrons limits the maximum allowable operating bias and is a major reliability concern.

To relieve these hot-electron induced problems, many graded-drain structures such as offset-gate, double-diffused drain, and lightly-doped-drain (LDD) have been proposed. These structures lower the channel electric field in the device by providing a section of the drain and source with lower density doping. This lower density doping section drops part of the applied voltage and thereby lowers the intensity of the electric field. Unfortunately, the offset-gate structure and the double-diffused drain are not suitable for sub-micron channel-length devices. The lightly-doped-drain (LDD) structure is suitable for sub-micron channel-length devices. However, one or two additional masking steps are required to manufacture such a device in CMOS circuits. If the circuit contains only n-type or only p-type LDD devices, one extra masking step beyond that normally needed to manufacture a VLSI device is required to form the LDD structure. However, if the circuit contains both n-type and p-type LDD devices, then two extra masking steps beyond that normally needed to manufacture a CMOS VLSI circuit is required. This is costly.

This invention presents a new way to achieve the LDD structure in CMOS circuits without using extra masking steps. This new process uses multiple layer side wall spacers similar to those described in a pending patent application entitled *Side Wall Masked Isolation For Semiconductor Fabrication*, Ser. No. 679,618, incorporated herein by reference. The present invention has a new and completely unanticipated use of side wall spacers. Also, a new process for forming the side wall spacers and the lightly doped regions is presented. In the abovereferenced patent application, a method is disclosed which uses side walls in manufacturing an oxide layer to avoid the formation of the so-called "bird's beak" structure and a few other process- or structure-induced defects. The walls and part of the bottom of a channel are covered with a thin silicon nitride ($Si_3N_4$) layer. An oxide is grown in the channels which pushes the thin silicon nitride layer out of the channel and produces smooth walls without the bird's beak structure and other malformations. The thin nitride layer is then removed. The present invention uses side walls to shield regions of the source and drain adjacent to the gate from ion implantation when the source and drain are heavily doped. After these heavily-doped source and drain regions are formed, the side wall spacers are removed with a wet etching process and the newly exposed areas immediately adjacent to the gate are lightly doped. In this manner, a source and a drain with two regions of differing concentrations of doping are formed.

DETAILED DESCRIPTION OF THE INVENTION

Figure 1A:
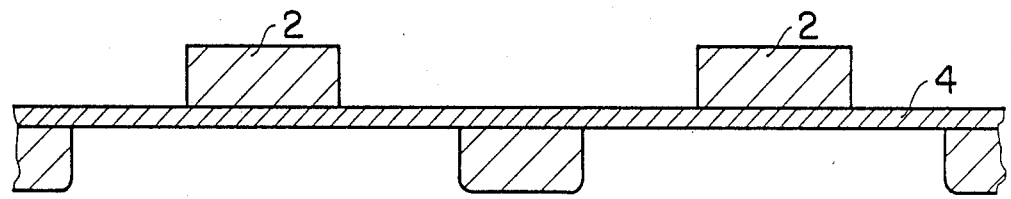
FIGS. 1A–1H and 1J–1L illustrate the steps in the maskless lightly-doped-drain process in accordance with the invention.
Figure 1B:
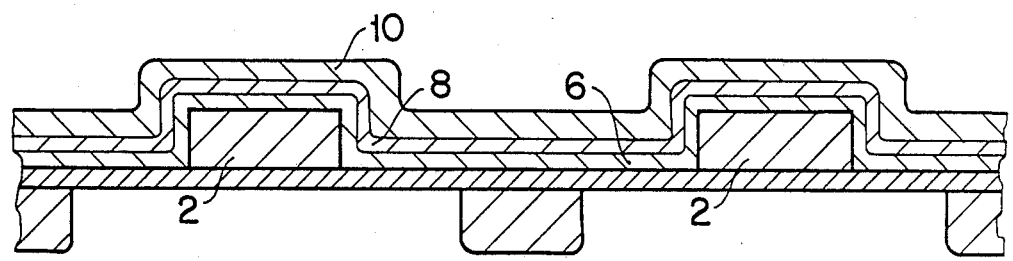
Figure 1C:
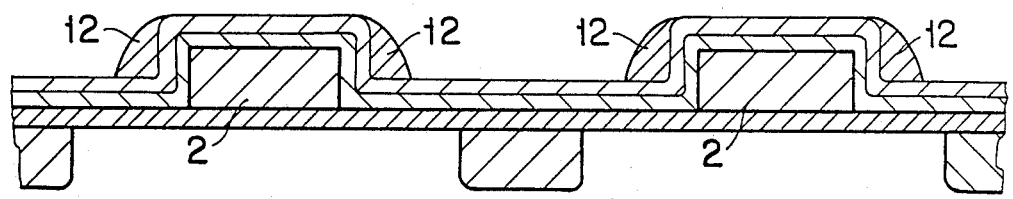

FIGS. 1A–1H and 1J–1L show the steps for manufacturing lightly doped regions in the drain and source of a transistor in accordance with the preferred embodiment of the invention. Poly-silicon gates 2 are formed on a single crystal silicon substrate 4 as shown in FIG. 1A. Two or three layers of thin film 6, 8, 10 are deposited (or grown) on the substrate 4 and gates 2 as shown in FIG. 1B. Each layer is capable of being an etch-stop for the next layer. The first layer 6 is optional; this layer 6 is a protective layer and, in the preferred embodiment, is a layer of silicon dioxide ($SiO_2$) which is either grown at 900° C. in dry ambient or chemically vapor deposited at low pressure with a thickness of about 10 nm. The second layer 8 is usually a low pressure chemically vapor deposited (LPCVD) silicon nitride ($Si_3N_4$) with a thickness of about 25 nm. The third layer 10 is typically a layer of LPCVD-poly-silicon of a proper thickness. In the preferred embodiment, this thickness is between 220 nm and 150 nm. This layer 10 forms the outer portion of the side wall spacer 12 shown in FIG. 1C.

Figure 1D:
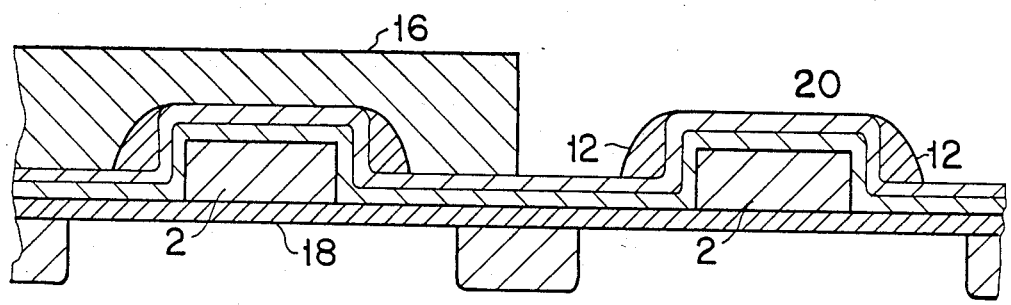

An anisotropic dry plasma etching process is used to remove most of the third layer 10. The silicon nitride second layer 8 acts as an etch-stop with etching process. In the plasma etching process, the portions along the sides of the gates 2 remain to form side walls 12. An ion implantation mask 16 is formed next. This mask 16 may be a conventional photoresist, such as Shipley #1470, available from Shipley Company, Inc. of Newton, Mass., 02162. As shown in FIG. 1D, the mask 16 is formed over devices 18 of one polarity, either n-channel or p-channel devices, while devices 20 of the opposite polarity, correspondingly either p-channel or n-channel devices, are ready for source and drain ion implantation.

Figure 1E:
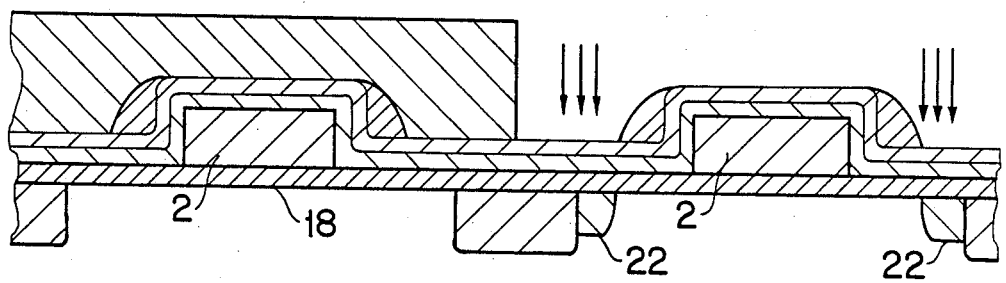
Figure 1F:
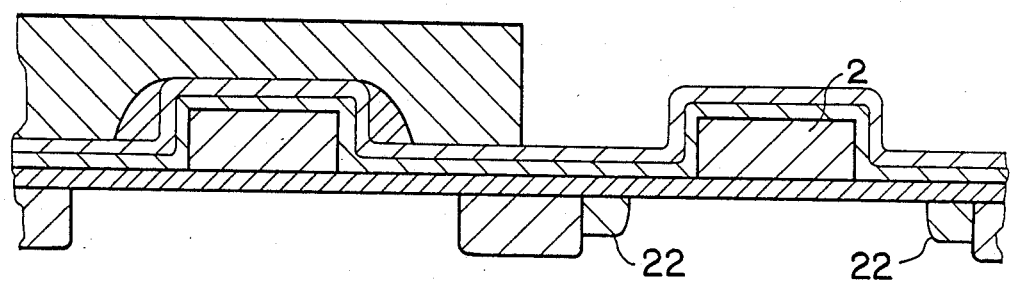
Figure 1G:
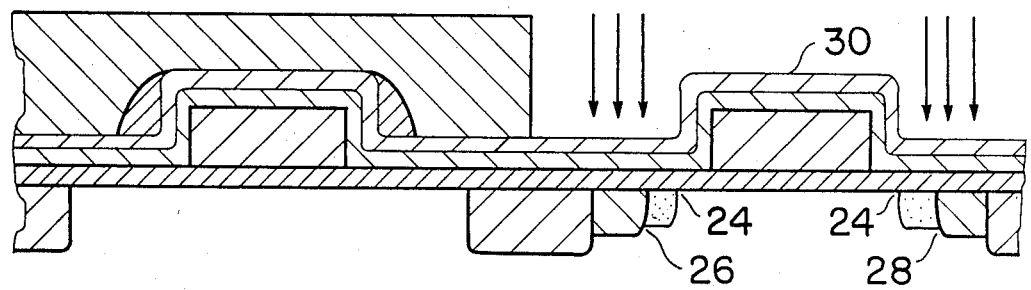

Next, heavily doped source and drain regions 22, as shown in FIG. 1E, are formed, using a standard ion implantation technique using, for example, arsenic or phosphorous for an n-channel device and boron for a p-channel device. In the preferred embodiment, the concentration of ions is approximately 2 to $7\times 10^{15}/cm^2$. During the ion implantation, the side walls 12 block the ions from penetrating the region beneath them. Next, the poly-silicon portion of the side walls 12 are stripped off with, for example, a wet chemical etching technique or an isotropic dry etching technique to expose areas which are to be less heavily doped. The resultant structure is shown in FIG. 1F. An ion implantation technique, such as that described above, is applied to form a less heavily doped region 24 as shown in FIG. 1G. In the preferred embodiment, the concentration of ions in this less heavily doped region 24 is approximately 0.5 to $2\times 10^{13}/cm^2$. These regions of lesser dopant form part of the source 26 and the drain 28 of the transistor 30.

Figure 1H:
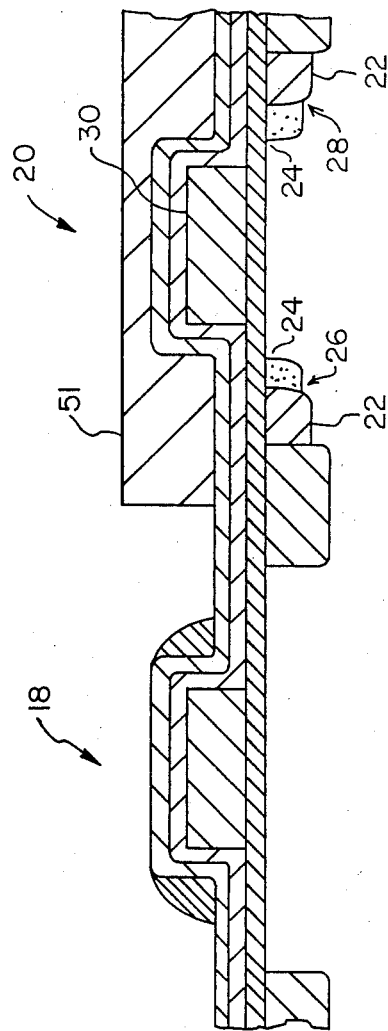
Figure 1J:
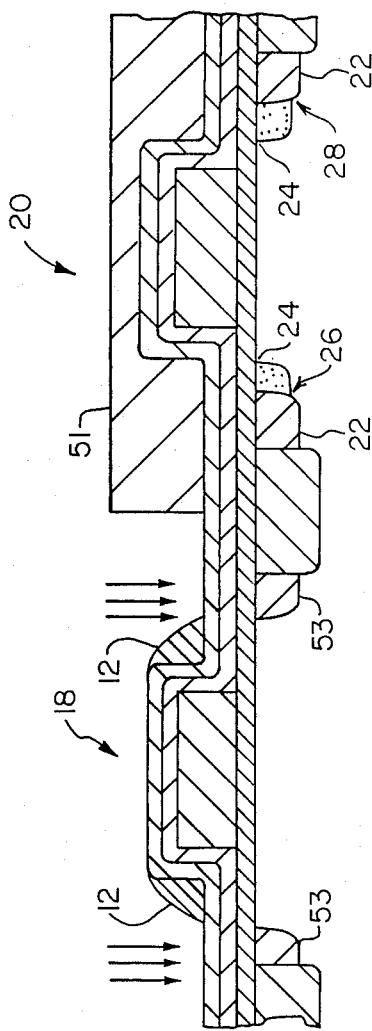
Figure 1K:
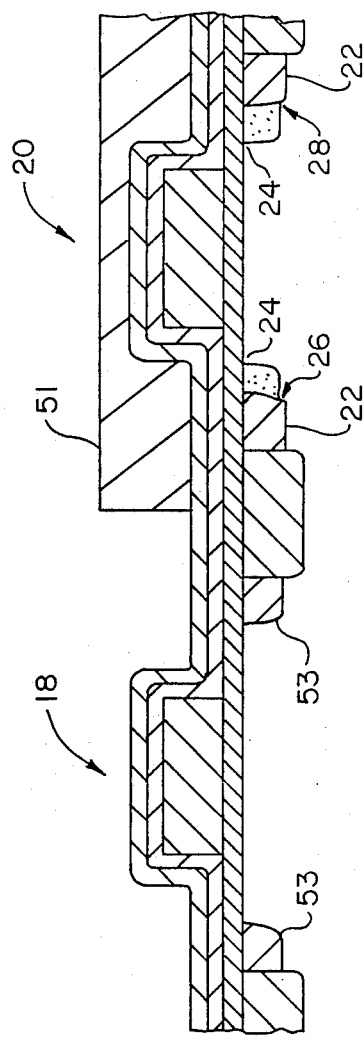
Figure 1L:
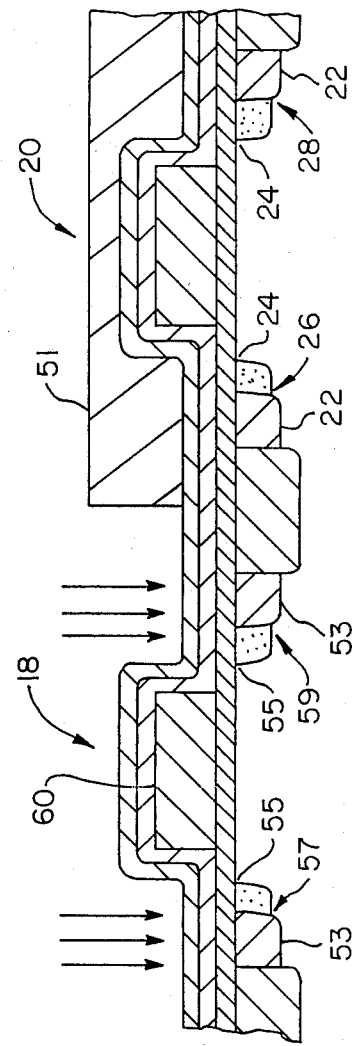

After this procedure is completed and the transistor 30 is formed, the photo-resist mask 16 is stripped off. This method can then be repeated on the other device 20 of opposite polarity. Specifically, an ion implantation mask 51 is formed next. As shown in FIG. 1H, the mask 51 is formed over devices 20 which have already been formed into transistors 30, the devices 18 which were previously masked now being ready for source and drain ion implantation. Next, heavily doped source and drain regions 53, as shown in FIG. 1J, are formed in the manner previously described with reference to forming the regions 22. The side walls 12 block the ions from penetrating the region beneath the side walls 12. Next, the side walls 12 are stripped as previously described, resulting in the structure shown in FIG. 1K. An ion implantation technique, similar to the technique used to form the regions 24, is applied to form less heavily doped regions 55 as shown in FIG. 1L. These regions 55 of lesser dopant, together with the regions 53, form a source 57 and a drain 59 of a transistor 60. Finally, the mask 51 is stripped off.

Figure 2A:
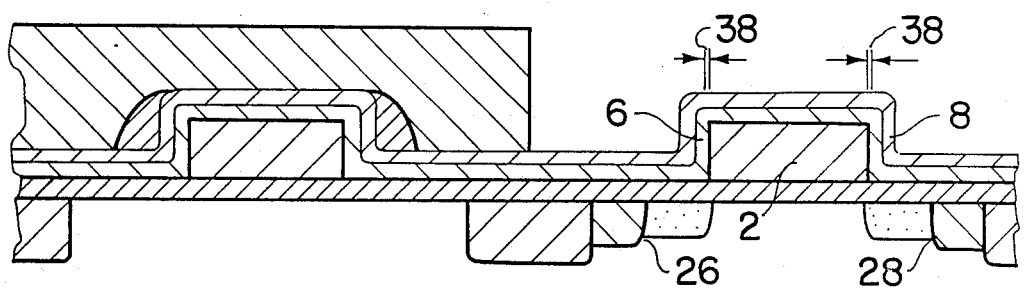
FIGS. 2A–B illustrate the effect the first and second layers have on the width of the gate-to-source or gate-to-drain overlap.
Figure 2B:
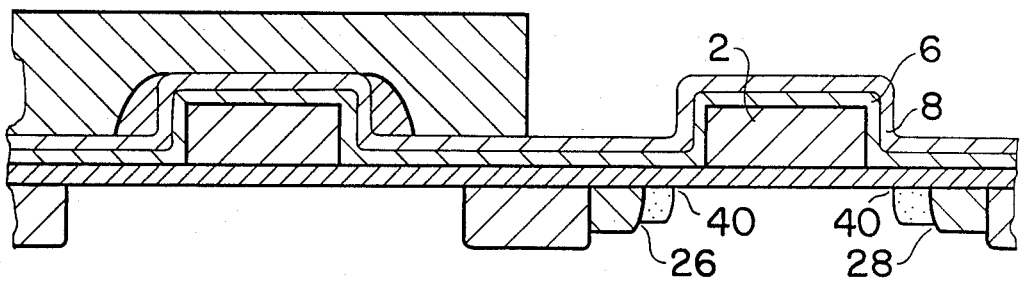

The total thickness of the optional first layer 6 and the second layer 8 is adjusted to obtain the proper gate 2 to source 26 and gate 2 to drain 28 overlap 38, 40 shown in FIGS. 2A and 2B. In FIG. 2A, the first layer 6 and second layer 8 are made narrow to produce a gate-to-source or gate-to-drain overlap 38. In FIG. 2B, the first layer 6 and second layer 8 are made thick to produce no gate-to-source or gate-to-drain overlap 40. The amount of source and drain overlap with the gate has a direct impact on effective channel length control and the short-channels effects.

The process described above is fully compatible with the self-aligned silicide process of the prior art. After both n- and p-channel devices are formed, the nitride etch-stop layer can be removed and a new oxide side wall spacer be formed to prevent gate-to-source or gate-to-drain shorts before the silicide is formed. In this self-aligned silicide process, the final spacer thickness will be non-critical since its dimension will not affect device characteristics.

We claim:

1. A method of producing a plurality of lightly doped drain MOS transistors of different polarities on a single substrate, the method comprising:
   (a) forming a plurality of gates on a surface of a single semiconductor substrate, selected ones of the gates defining first polarity areas and the remainder of the gates defining second polarity areas;
   (b) covering top and side portions of said gates and portions of said surface of said substrate with an etch-stop layer comprising a silicon nitride;
   (c) covering said etch-stop layer with a polysilicon layer;
   (d) selectively removing portions of said polysilicon layer to leave polysilicon sidewalls abutting said etch-stop covered gates;
   (e) forming a first ion implantation mask over the first polarity areas,
   (f) doping the substrate using as masks the gates and abutting sidewalls in the second polarity areas and the first ion implantation mask to form self-aligned second polarity main source and drain regions in the second polarity areas;
   (g) removing the sidewalls abutting the gates in the second polarity areas;
   (h) relatively lightly doping the substrate using as masks the gates in the second polarity areas and the first implantation mask to form self-aligned, lightly doped second polarity source and drain regions which contact said main source and drain regions, respectively, whereby a portion of the substrate extending between each gate and its associated lightly doped source and drain reigons defines a channel region, each such gate and its associated source and drain regions defining a transistor of the second polarity;
   (i) removing the first ion implantation mask;
   (j) forming a second ion implantation mask over the second polarity areas,
   (k) doping the substrate using as masks the gates and abutting sidewalls in the first polarity areas and the second ion implantation mask to form self-aligned first polarity main source and drain regions in the first polarity areas;
   (l) removing the sidewalls abutting the gates in the first polarity areas;
   (m) relatively lightly doping the substrate using as masks the gates in the first polarity areas and the second implantation mask to form self-aligned, lightly doped first polarity source and drain regions which contact said first polarity main source and drain regions, respectively, whereby a portion of the substrate extending between each gate and its associated lightly doped first polarity source and drain regions defines a channel region, each such gate and its associated source and drain regions defining a transistor of the first polarity; and
   (n) removing the second ion implantation mask.

2. A method as recited in claim 1 further comprising the step of forming a protective layer over top and side portions said gate and over said surface of said substrate before covering said gate and substrate with said etch-stop layer.

3. A method as recited in claim 1 wherein the step for removing portions of said polysilicon layer includes using said etch-stop layer to control said etching.

4. A method as recited in claim 1 wherein the step for removing portions of said polysilicon layer includes using an antisotropic etching process.

5. A method as recited in claim 1 wherein the step for removing said sidewalls includes a wet etching process.

6. A method as recited in claim 1 further comprising the step of adjusting the thickness of said polysilicon layer to vary the overlap of said gate with said lightly-doped source and drain regions.

* * * * *